(12) United States Patent
Filippou et al.

(10) Patent No.: US 10,957,848 B2
(45) Date of Patent: Mar. 23, 2021

(54) HEUSLER COMPOUNDS WITH NON-MAGNETIC SPACER LAYER FOR FORMATION OF SYNTHETIC ANTI-FERROMAGNETS (SAF)

(71) Applicants: International Business Machines Corporation, Armonk, NY (US); Samsung Electronics Co., LTD., Gyeonggi-do (KR)

(72) Inventors: Panagiotis Charilaos Filippou, San Jose, CA (US); Chirag Garg, San Jose, CA (US); Yari Ferrante, San Jose, CA (US); Stuart S. P. Parkin, San Jose, CA (US); Jaewoo Jeong, Los Altos, CA (US); Mahesh G. Samant, San Jose, CA (US)

(73) Assignees: International Business Machines Corporation, Armonk, NY (US); Samsung Electronics Co., Ltd.

( * ) Notice: Subject to any disclaimer, the term of this patent is extended or adjusted under 35 U.S.C. 154(b) by 61 days.

(21) Appl. No.: 16/271,721

(22) Filed: Feb. 8, 2019

(65) Prior Publication Data
US 2020/0259076 A1     Aug. 13, 2020

(51) Int. Cl.
| | | |
|---|---|---|
| H01L 43/10 | (2006.01) | |
| H01L 43/12 | (2006.01) | |
| H01L 43/02 | (2006.01) | |
| H01F 1/40 | (2006.01) | |

(52) U.S. Cl.
CPC ............. *H01L 43/10* (2013.01); *H01F 1/408* (2013.01); *H01L 43/02* (2013.01); *H01L 43/12* (2013.01)

(58) Field of Classification Search
CPC ......... H01L 43/02; H01L 43/10; H01L 43/12; H01F 1/408; H01F 10/1936
See application file for complete search history.

(56) References Cited

U.S. PATENT DOCUMENTS

| | | |
|---|---|---|
| 6,834,005 B1 | 12/2004 | Parkin |
| 7,672,088 B2 | 3/2010 | Zhang et al. |
| 10,177,305 B2 * | 1/2019 | Jeong ..................... G11C 11/16 |

(Continued)

FOREIGN PATENT DOCUMENTS

| | | |
|---|---|---|
| CN | 108010549 | 5/2018 |
| CN | 108010549 A | 5/2018 |

(Continued)

*Primary Examiner* — Christine A Enad
(74) *Attorney, Agent, or Firm* — Schmeiser, Olsen & Watts, LLP

(57) ABSTRACT

Devices are described that include a multi-layered structure that comprises three layers. The first layer is a magnetic Heusler compound, the second layer (acting as a spacer layer) is non-magnetic at room temperature and comprises alternating layers of Ru and at least one other element E (preferably Al; or Ga or Al alloyed with Ga, Ge, Sn or combinations thereof), and the third layer is also a magnetic Heusler compound. The composition of the second layer is represented by $Ru_{1-x}E_x$, with x being in the range from 0.45 to 0.55. An MRAM element may be constructed by forming, in turn, a substrate, the multi-layered structure, a tunnel barrier, and an additional magnetic layer (whose magnetic moment is switchable).

34 Claims, 18 Drawing Sheets

(56) References Cited

U.S. PATENT DOCUMENTS

| | | |
|---|---|---|
| 10,396,123 B2 | 8/2019 | Jeong et al. |
| 2008/0164548 A1* | 7/2008 | Ranjan ................ G11C 11/1675 257/421 |
| 2014/0301136 A1* | 10/2014 | Inokuchi ............. G11C 11/2275 365/158 |
| 2015/0129996 A1 | 5/2015 | Tang et al. |
| 2018/0006213 A1* | 1/2018 | Park ........................ G11C 11/15 |
| 2018/0205008 A1* | 7/2018 | Jeong ...................... H01F 10/16 |
| 2019/0295617 A1* | 9/2019 | Wang ...................... G06F 7/588 |

FOREIGN PATENT DOCUMENTS

| | | |
|---|---|---|
| WO | 2016209267 A1 | 12/2016 |
| WO | 2018125196 A1 | 7/2018 |

\* cited by examiner

HEUSLER COMPOUNDS WITH NON-MAGNETIC SPACER LAYER FOR FORMATION OF SYNTHETIC ANTI-FERROMAGNETS (SAF)

TECHNICAL FIELD

The invention is in the field of magnetic random access memory (MRAM), and more particularly, MRAM devices that rely on spin transfer torque, racetrack memory, and hard disk storage.

BACKGROUND

The Heusler compounds are a class of materials having the representative formula $X_2YZ$, where X and Y are transition metals or lanthanides, and Z is from a main group element. Due to the chemical distinction between X (or Y) and Z, they form a unique structure defined by the space group symmetry $L2_1$ (or $D0_{22}$ when they are tetragonally distorted), where four face-centered cubic structures penetrate each other. The properties of Heusler compounds are strongly dependent on the ordering of the elements constituting the compounds. Thus, the fabrication of high quality Heusler films typically requires high temperature thermal processes, for example, deposition at temperatures significantly above room temperature and/or thermal annealing at high temperatures (400° C. or higher).

SUMMARY

Disclosed herein are highly textured (epitaxial), very smooth, high quality ultrathin bilayer films of Heusler compounds separated by a non-magnetic templating spacer layer, which can be fabricated without a thermal annealing process. The templating spacer layer is preferably formed from a binary alloy of Ru—Al with the B2 structure, the cubic version of $L1_0$. The templating layer can be deposited at room temperature and is ordered (i.e., the formation of alternating atomic layers of Ru and Al), even in the as-deposited state.

Of particular interest are ultrathin bilayer films of Heusler compounds deposited with RuAl templating spacer layers, with these structures being highly epitaxial and ordered. The Heusler compounds disclosed herein form high quality films with excellent magnetic properties, having large perpendicular magnetic anisotropy and square magnetic hysteresis loops (with the remanent moment in zero magnetic field being close to the saturation moment of each individual layer). These advantageous properties are attributed to the similarity between the B2 symmetry of the templating layer and the $L2_1$ (or $D0_{22}$) symmetry of the Heusler layers. An important property of the structures made from ultrathin bilayer films of Heusler compounds with an RuAl templating spacer layer is that the relative orientation of the magnetic moments of the two Heusler layers depends on the thickness of the RuAl spacer layer. For thicknesses in the ranges 4 to 10 Å and 15 to 16 Å, this relative orientation of magnetic moments is anti-parallel. Based on the previously observed periodicity of oscillatory coupling with elemental Cr and Ru layers, a second thickness range of anti-parallel coupling of magnetic moments is expected from 15 Å to ~20 Å. This antiferromagnetic oscillatory coupling effect is not observed with a CoAl templating spacer layer, where the magnetic moments of the two Heusler-containing layers are always parallel to each other, independent of the spacer layer thickness, up to at least 15 Å and even to 20 Å or more.

The most important characteristic of the templating spacer layer is that it is composed of elements that are found in Heusler compounds. Thus, for example, any intermixing or diffusion of the Al from a RuAl underlayer into the Heusler-containing layer does not significantly change the properties of the Heusler-containing layer, since Al is from the class of "Z elements" (see Background) from which the Heusler compounds are formed. Similarly, a layer that partially replaces Al with other Z elements, such as Ga, Ge and/or Sn, would be suitable as a templating spacer layer.

Another important property of the templating spacer layer is that it can replicate the induced physical ordering of the first Heusler-containing layer and in turn promote the ordering of the second Heusler-containing layer, which is grown on top of the templating spacer layer. The first Heusler-containing layer will inevitably have terraces (see FIG. 1), with atomic steps between neighboring terraces that separate a terrace with a surface formed from X (or Y) from a terrace formed from XZ (see Background for a discussion of X, Y, and Z). Due to the chemical affinity of X (or Y) to Al, and of Z to Ru, the first Heusler-containing layer will promote the ordering of the templating spacer layer and, for the same reasons mentioned previously, will in turn promote ordering in the second Heusler-containing layer at modest temperatures (even at room temperature), as illustrated in FIG. 1.

One embodiment of the invention is a device that includes a multi-layered structure. This structure includes a first magnetic Heusler compound, a second layer that is non-magnetic at room temperature and which is in contact with and overlies the first layer, and a third layer that is in contact with and overlies the second layer. The third layer includes a second magnetic Heusler compound. The second layer comprises both Ru and at least one other element E, in which the composition of the second layer is represented by $Ru_{1-x}E_x$, with x being in the range from 0.45 to 0.55. More preferably x is in the range from 0.47 to 0.53. In a preferred embodiment E is aluminum, and the first and third layers each have a thickness of less than 5 nm or even 3 nm. The first and second Heusler compounds may be advantageously independently selected from the group consisting of $Mn_{3.1-x}Ge$, $Mn_{3.1-x}Sn$, and $Mn_{3.1-x}Sb$, with x being in the range from 0 to 1.1 in the case of $Mn_{3.1-x}Sb$, and with x being in the range from 0 to 0.6 for $Mn_{3.1-x}Ge$ and $Mn_{3.1-x}Sn$. The first and/or the second Heusler compounds may be a ternary alloy, e.g., of the form $Mn_{3.1-x}Co_{1.1-y}Sn$, wherein $x \leq 1.2$ and $y \leq 1.0$. In some embodiments, the magnetic moments of the first and third layers are substantially parallel (or alternatively perpendicular) to the interfaces between (i) the second layer and (ii) the first and third layers, respectively. Also, the magnetic moments of the first and third layers may be substantially anti-parallel to each other, in which the second layer has a thickness in the range of 6 to 10 Å. Preferred embodiments of the device may be used as a memory element or as an element of a racetrack memory device.

Another embodiment of the invention is a device that includes a substrate, a multi-layered structure overlying the substrate, in which the structure includes a first layer, a second layer, and a third layer. The first layer includes a first magnetic Heusler compound, the second layer is non-magnetic at room temperature and comprises Ru and E (in which E comprises at least one other element that includes Al, the composition of the second layer being given by $Ru_{1-x}E_x$, with x in the range from 0.45 to 0.55), and the third layer includes a second magnetic Heusler compound. The device further includes a tunnel barrier overlying the multi-layered structure and an additional magnetic layer in contact with the tunnel barrier, in which the additional magnetic layer has a switchable magnetic moment. In a preferred embodiment, at least one of the first and third layers includes Co.

Yet another embodiment of the invention is a device that includes a multi-layered structure comprising a first layer, a second layer, and a third layer, in which the first layer is magnetic and includes a Heusler and/or a $L1_0$ compound, the second layer is non-magnetic at room temperature and comprises Ru and E (with E including at least one other element that includes Al, the composition of the second layer being represented by $Ru_{1-x}E$, with x in the range from 0.45 to 0.55), and the third layer is magnetic and includes a Heusler and/or a $L1_0$ compound. The $L1_0$ compound may be advantageously selected from the group consisting of MnGa, MnAl, FeAl, MnGe, MnSb, and MnSn alloys. Preferred embodiments of the device may be used as memory element or as an element of a racetrack memory device.

DETAILED DESCRIPTION

New magnetic materials are needed to allow for scaling of STT-MRAM (spin transfer torque-magnetic random access memories) beyond the 20 nm node. These materials must have very large perpendicular magnetic anisotropy (PMA) and, for integration purposes, be compatible with conventional CMOS technologies. Such magnetic materials form electrodes of magnetic tunnel junction (MTJ) based memory elements. An important mechanism for switching the state of the MTJ element is passing spin polarized tunneling current through the MTJ. The magnitude of this current is limited by the size of the transistors used to provide the write current. This means that the thickness of the electrode must be sufficiently small that it can be switched by the available current. For magnetization values of ~1000 emu/cm³, the electrode must have a thickness that does not exceed approximately 1 nm.

Recently it has been shown that using templating layers, such as CoAl, CoGa, CoSn, or CoGe, it is possible to deposit an ultrathin Heusler layer (thickness of ~1 nm) having bulk like magnetic properties (see U.S. patent application Ser. No. 15/660,681 filed 26 Jul. 2017 and U.S. patent Ser. No. 10/177,305 issued 8 Jan. 2019). These ultrathin Heusler compound films of even a single unit cell thickness showed perpendicular magnetic anisotropy and square magnetic hysteresis loops, making them candidate materials for use in STT-MRAM and racetrack memory applications. In both technology applications, a synthetic anti-ferromagnet (SAF) is advantageously used. In an STT-MRAM application, the reference layer includes an SAF structure, since this structure has very small fringing fields, which are the primary cause of the offset fields observed in the measured hysteresis loops of the storage layer. In a race-track memory, the domain wall velocities in nano-wires of an SAF structure are significantly higher than those in the nano-wires of conventional ferromagnets. The SAF structures from conventional ferromagnets use Ru as the non-magnetic spacer layer. The family of tetragonal Heusler compounds, which include $Mn_3Z$ with Z=Ge, Sn, and Sb, have a layered structure of alternating layers of Mn—Mn and Mn—Z. The use of a known elemental spacer layer (e.g., using Ru alone) does not work for structures including two Heusler layers, since elemental Ru is unable to replicate the ordering of the Heusler layer underneath it; thus, it is unable to promote the ordering in the second Heusler layer grown over the Ru spacer layer.

Disclosed herein is a spacer layer that promotes the formation of an SAF structure between Heusler layers. It is shown that a RuAl alloy spacer layer having the CsCl structure induces anti-ferromagnetic coupling between two tetragonal Heusler compound layers separated by that spacer layer.

RuAl Templating Layer

Figure 1:
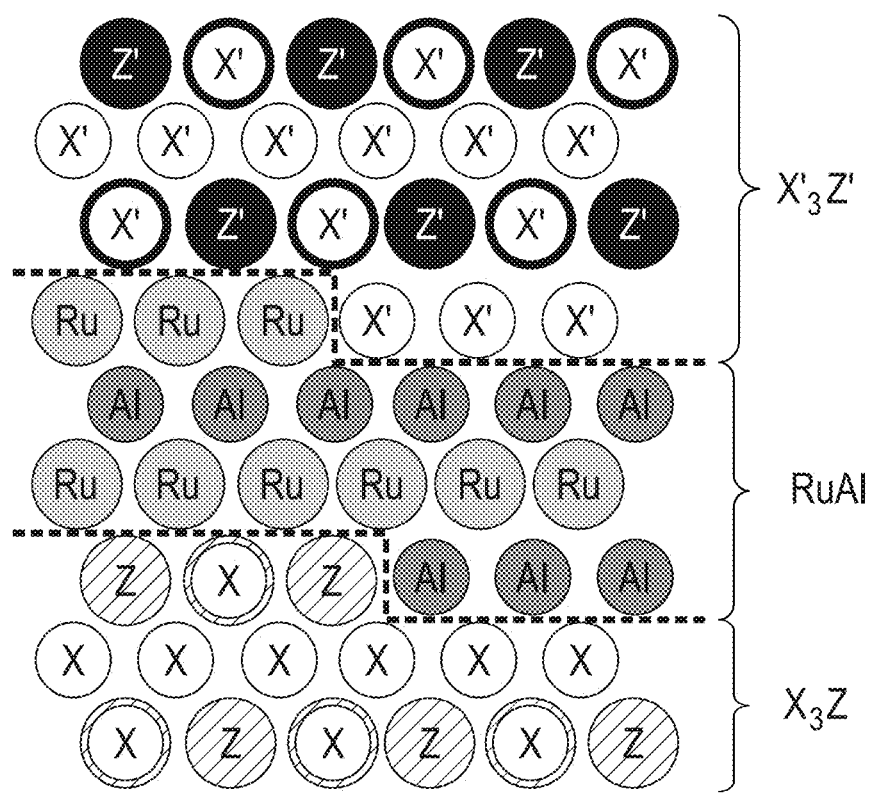
FIG. 1. Illustration of the templating concept using a bilayer of Heusler compounds separated by a RuAl spacer layer. X, X' represent transition metal elements, and Z, Z' represent main group elements.
Figure 2A:
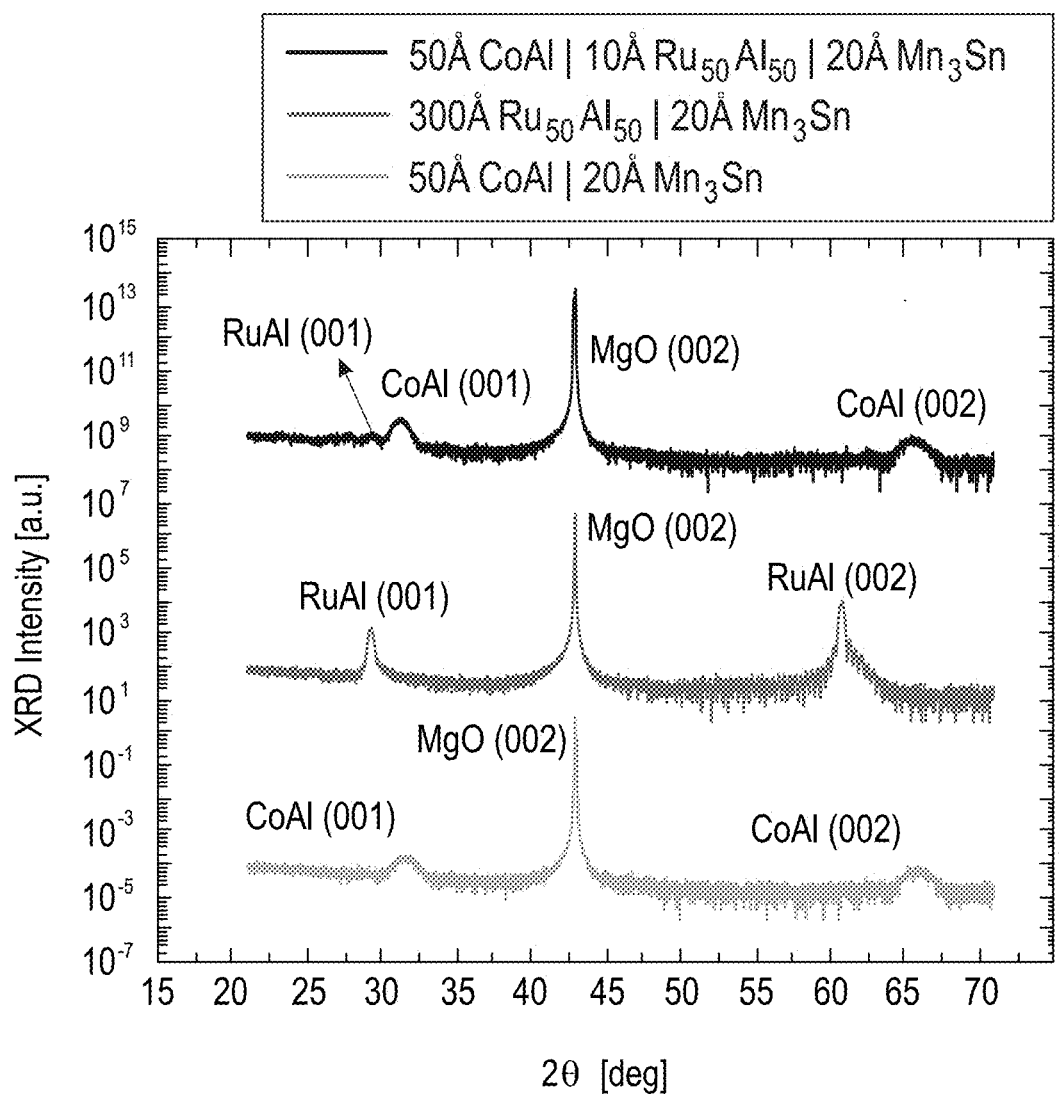
FIG. 2A. XRD scans for three different stacks on a MgO/MgO(001) substrate. The templating layers were deposited at room temperature and annealed in situ at 400° C. in vacuum.

Single crystal epitaxial films of $Ru_{1-x}Al_x$ alloy were grown by dc-magnetron sputtering in an ultra-high vacuum (UHV) chamber with a base pressure of ~2×10$^{-9}$ Torr. Argon was used as the sputter gas at a typical gas pressure of 3 mTorr. The MgO buffer layer was prepared by depositing 20 Å thick MgO at room temperature using ion-beam deposition (IBD) from a MgO target obtained from Kojundo Chemical Laboratory. Alternately, this MgO buffer layer can be deposited at room temperature by RF magnetron sputtering from an MgO target (Kojundo Chemical Laboratory). The templating layers (TL) of CoAl, CoAl/RuAl, or RuAl were then deposited at room temperature. The TL was annealed at 400° C. for 30 minutes in ultra-high vacuum and then cooled to room temperature prior to deposition of the subsequent layers, which included a Heusler layer (20 Å $Mn_3Sn$) and a cap bilayer of 20 Å MgO and 20 Å Ta. The cap bilayer protects the layers underneath it during the exposure of the entire stack to ambient environment. FIG. 2A shows the compositions of the CoAl and RuAl layers, which were determined by Rutherford backscattering measurements to be $Co_{51}Al_{49}$ and $Ru_{50}Al_{50}$, respectively. Although the RuAl layer composition of 1:1 in the current example was ideal, $Ru_{1-x}Al_x$ layers with x in the range from 0.45 to 0.55, and more preferably in the range from 0.47 to 0.53, will show similar templating effects (thereby, facilitating growth of alternating layers). Even larger deviations would be expected to make growth of these alternating layer structures difficult or impossible.

X-ray diffraction (XRD) θ-2θ scans in the out-of-plane geometry were performed on the films. FIG. 2A shows sets of XRD scans for three films: MgO(001)/20 Å MgO/50 Å CoAl/10 Å RuAl/20 Å $Mn_3Sn$/20 Å MgO/20 Å Ta; MgO(001)/20 Å MgO/300 Å RuAl/20 Å $Mn_3Sn$/20 Å MgO/20 Å Ta; and MgO(001)/20 Å MgO/50 Å CoAl 20 Å $Mn_3Sn$/20 Å MgO/20 Å Ta. The data show the main CoAl (002) peak at 2θ=~65.5°, as well as the CoAl (001) peak at 2θ=~31.4°, the RuAl (002) peak at 2θ=~60.75°, and the RuAl (001) peak at 2θ=~29.3°. The existence of the CoAl (001) and RuAl (001) superlattice peaks clearly prove that alternating layering of Co and Al is taking place; likewise, alternating layers of Ru and Al are formed. Even though the templating layers were annealed 400° C. for 30 minutes, it was found (not shown) that this annealing step is not needed to promote the growth of alternating layers of Co/Al and Ru/Al. The x-ray diffraction peak associated with the substrate was observed for all samples and is labeled as MgO(002). The lattice parameter of the CoAl film is ~2.86 Å, which is close to that of bulk CoAl in the B2 structure. The lattice parameter of the RuAl film is ~2.95 Å, which is close to that of bulk RuAl in the B2 structure.

Figure 2B:
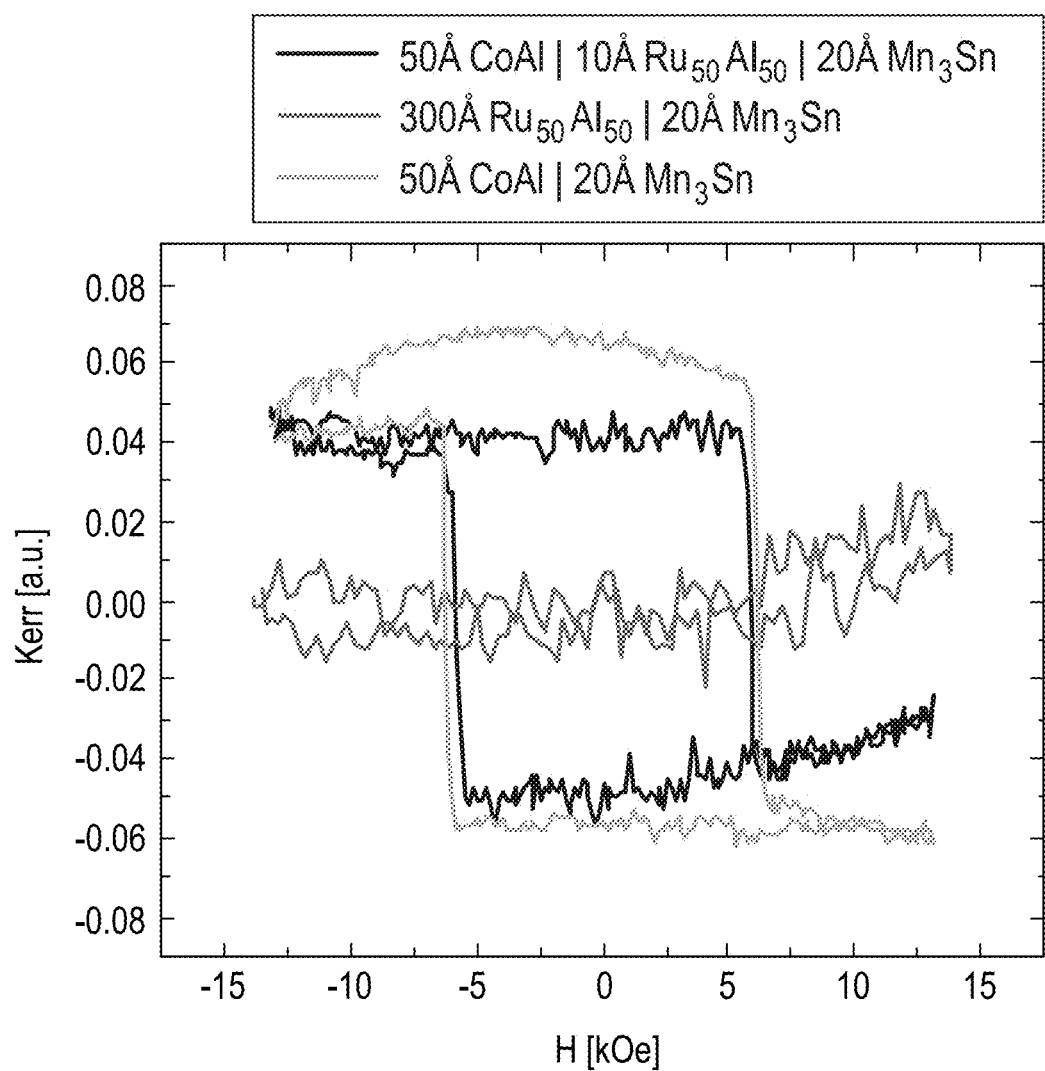
FIG. 2B. P-MOKE hysteresis loops at room temperature for the stacks of FIG. 2A.

FIG. 2B shows the perpendicular magneto-optic Kerr effect (P-MOKE) signal obtained from these three films as a function of the applied magnetic field. The square hysteresis loops for 20 Å $Mn_3Sn$ were obtained from films having, as their templating layers, either the bilayer CoAl/RuAl or the single layer CoAl. The 300 Å RuAl layer showed the alternating layer structure (see XRD data above), yet the 20 Å $Mn_3Sn$ did not show any magnetic hysteresis loop. This is due to the larger lattice mismatch (~7%) between the RuAl and $Mn_3Sn$ Heusler compounds, which strained the $Mn_3Sn$ layer sufficiently that it no longer exhibited PMA. However, these data do indicate that the RuAl templating layer is non-magnetic. Deposition of a RuAl layer on a CoAl layer strained the RuAl sufficiently that it promoted growth of an ordered, magnetic, 20 Å $Mn_3Sn$ layer. These films were very smooth with root mean square surface roughness ($r_{rms}$) of <2 Å, as measured by atomic force microscopy (AFM).

Figure 3A:
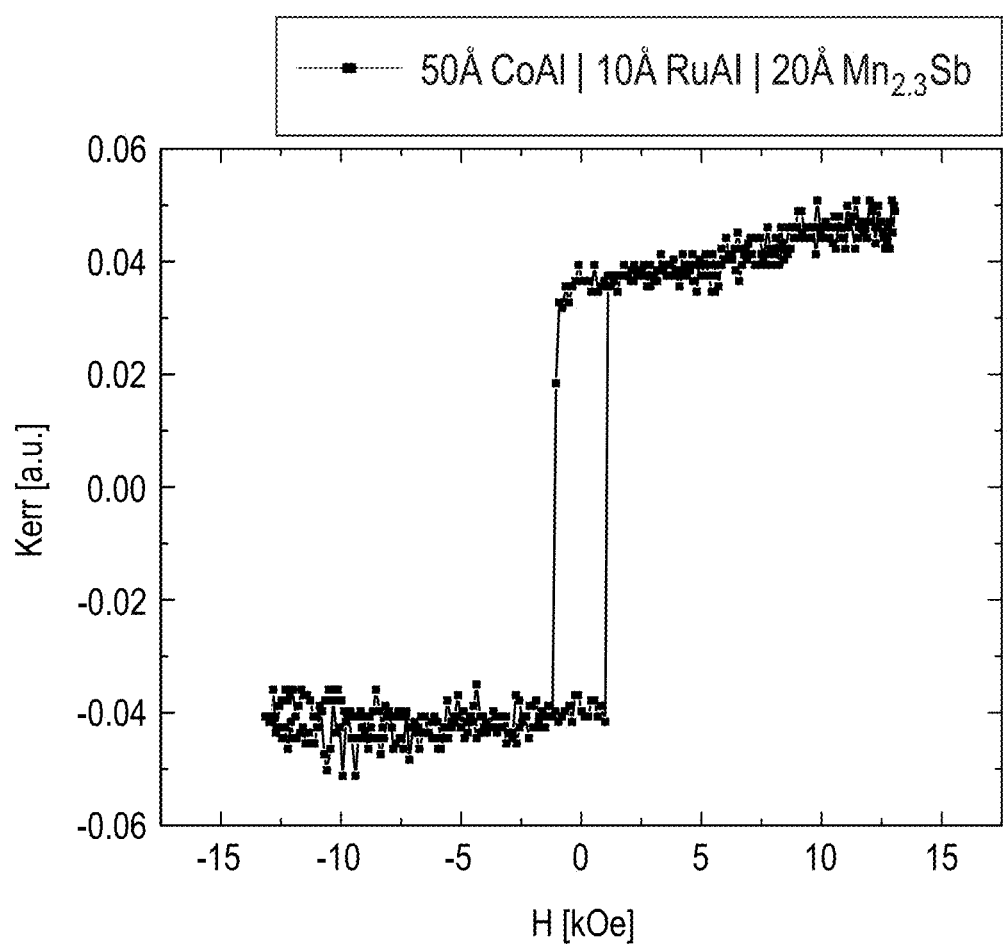
FIG. 3A. P-MOKE hysteresis loops from samples having a templating layer of 50 Å CoAl/10 Å RuAl in contact with a 20 Å thick $Mn_{2.3}Sb$ Heusler layer.
Figure 3B:
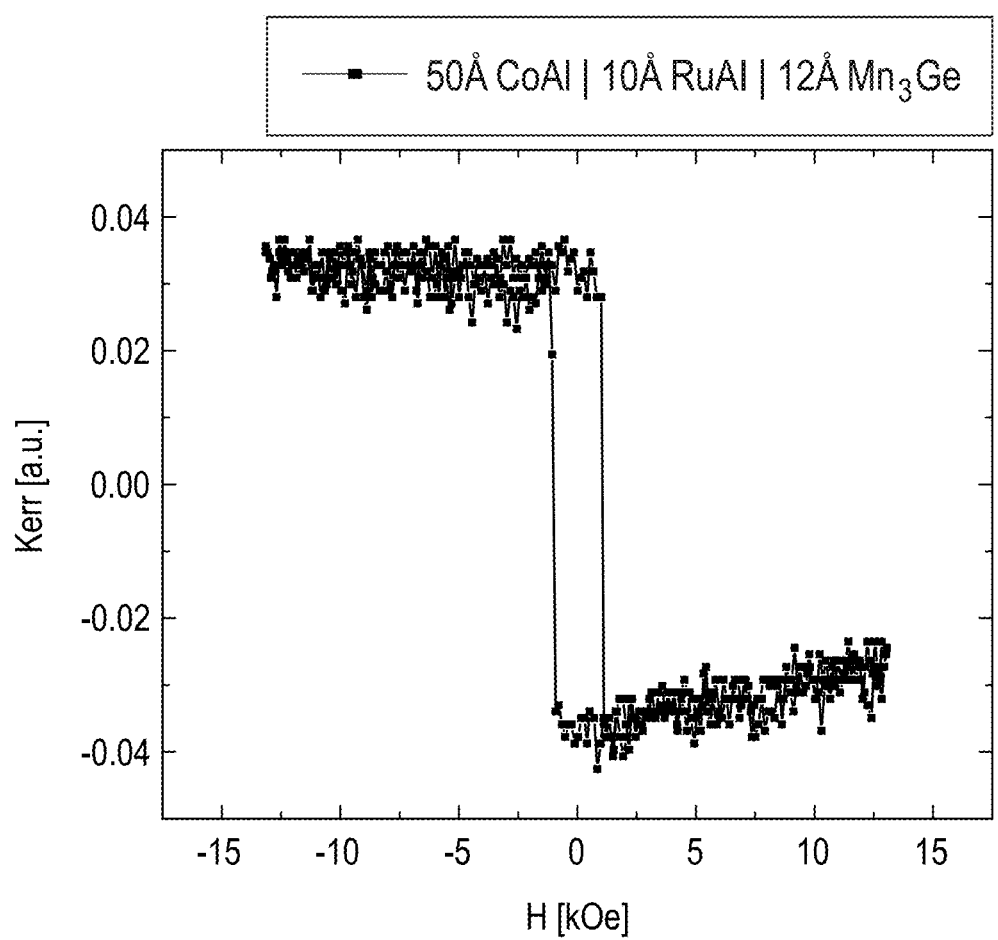
FIG. 3B. P-MOKE hysteresis loops from samples having a templating layer of 50 Å CoAl 10 Å RuAl in contact with a 12 Å $Mn_3Ge$ Heusler layer.

FIG. 3A shows a P-MOKE hysteresis loop for a $Mn_{2.3}Sb$ Heusler compound grown on a RuAl templating layer. The material stack for this sample was MgO(001)/20 Å MgO/50 Å CoAl/10 Å RuAl 20 Å $Mn_{2.3}Sb$/20 Å MgO/20 Å Ta. Similarly, FIG. 3B shows a P-MOKE hysteresis loop for a $Mn_3Ge$ Heusler compound grown on a RuAl templating layer. The material stack for this sample was MgO(001)/20 Å MgO/50 Å CoAl/10 Å RuAl/12 Å $Mn_3Ge$/20 Å MgO/20 Å Ta. The spin polarizations of $Mn_{2.3}Sb$ and $Mn_3Ge$ are opposite of each other, as are their Kerr contrasts, which leads to the opposite sign of the P-MOKE signal for these two Heusler layers. This has interesting consequences: The P-MOKE signal from a bilayer of $Mn_{2.3}Sb$ and $Mn_3Ge$, while sweeping the field, will be reduced when the two Heusler layers align independently with the external field and then become parallel. These results show that the RuAl templating layer can promote ordering within $Mn_3Z$ Heusler compounds (where Z=Ge, Sn, and Sb), such that they have perpendicular magnetic anisotropy.

Figure 4:
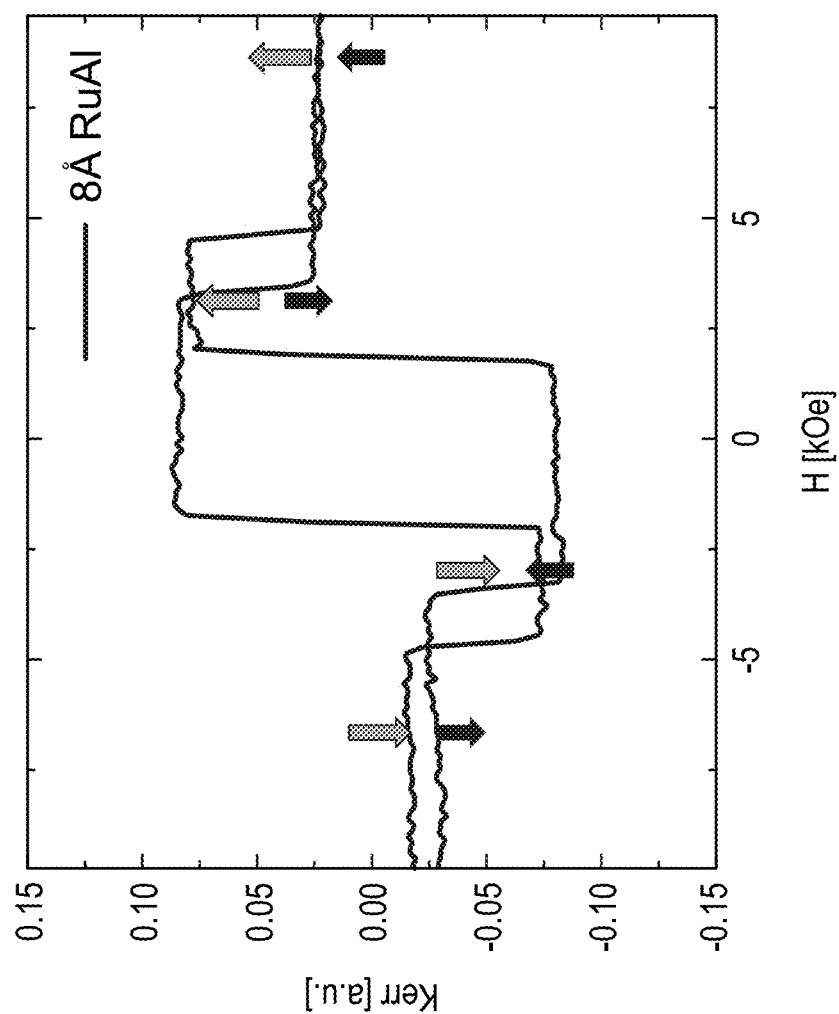
FIG. 4. P-MOKE hysteresis loop from the illustrated Heusler stack, which includes an 8 Å RuAl spacer layer. The magnetic moments of the two Heusler-containing layers at different positions in the hysteresis loop are indicated with arrows.
Figure 4:
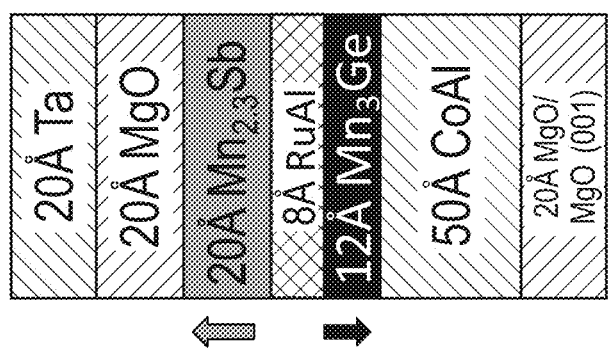

FIG. 4 includes the P-MOKE hysteresis loop obtained from a sample with two different layers of Heusler compounds separated by a non-magnetic spacer layer of RuAl. The stack of this sample was MgO(001)/20 Å MgO/50 Å CoAl/12 Å $Mn_3Ge$/t=8 Å RuAl/20 Å $Mn_{2.3}Sb$/20 Å MgO/20 Å Ta (where "t" represents thickness). Three distinct hysteresis loops are observed, and the sets of pairs of arrows overlayed in FIG. 4 indicate the orientations of the magnetization of the $Mn_3Ge$ and $Mn_{2.3}Sb$ layers. At high applied fields >5 kOe, the magnetizations of the two Heusler compounds are parallel to each other. At zero applied field, in the remanent state, the magnetizations of the two Heusler compounds are anti-parallel to each other. Thus, the presence of the 8 Å RuAl spacer layer separating the two Heusler compounds promotes the formation of a synthetic antiferromagnet (SAF). This is the first demonstration of an SAF structure based on Heusler compounds. Moreover, the Heusler compounds, along with their corresponding spacer layer, were deposited at room temperature, with the resulting SAF structure needing no subsequent annealing. Furthermore, in the case of two layers of Heusler compounds having magnetic moments that are in-plane, the presence of an 8 Å RuAl spacer layer separating these two Heusler layers will also lead to the formation of a synthetic antiferromagnet (SAF). More explicitly, here the magnetic moments of the Heusler layers are substantially parallel to the interfaces between the Heusler layer and the RuAl spacer layer separating them. The magnetic moments of the two Heusler layers may be substantially anti-parallel to each other when the RuAl spacer layer has a thickness in the range of 6 to 10 Å.

Although the thickness of the Heusler layers within the SAF structure used here was 1-2 nm, it is possible to form SAF structures with significantly thicker Heusler layers. For technologically relevant SAF structures, the thickness of the Heusler layers is expected to be less than 5 nm or even less than 3 nm.

Figure 5:
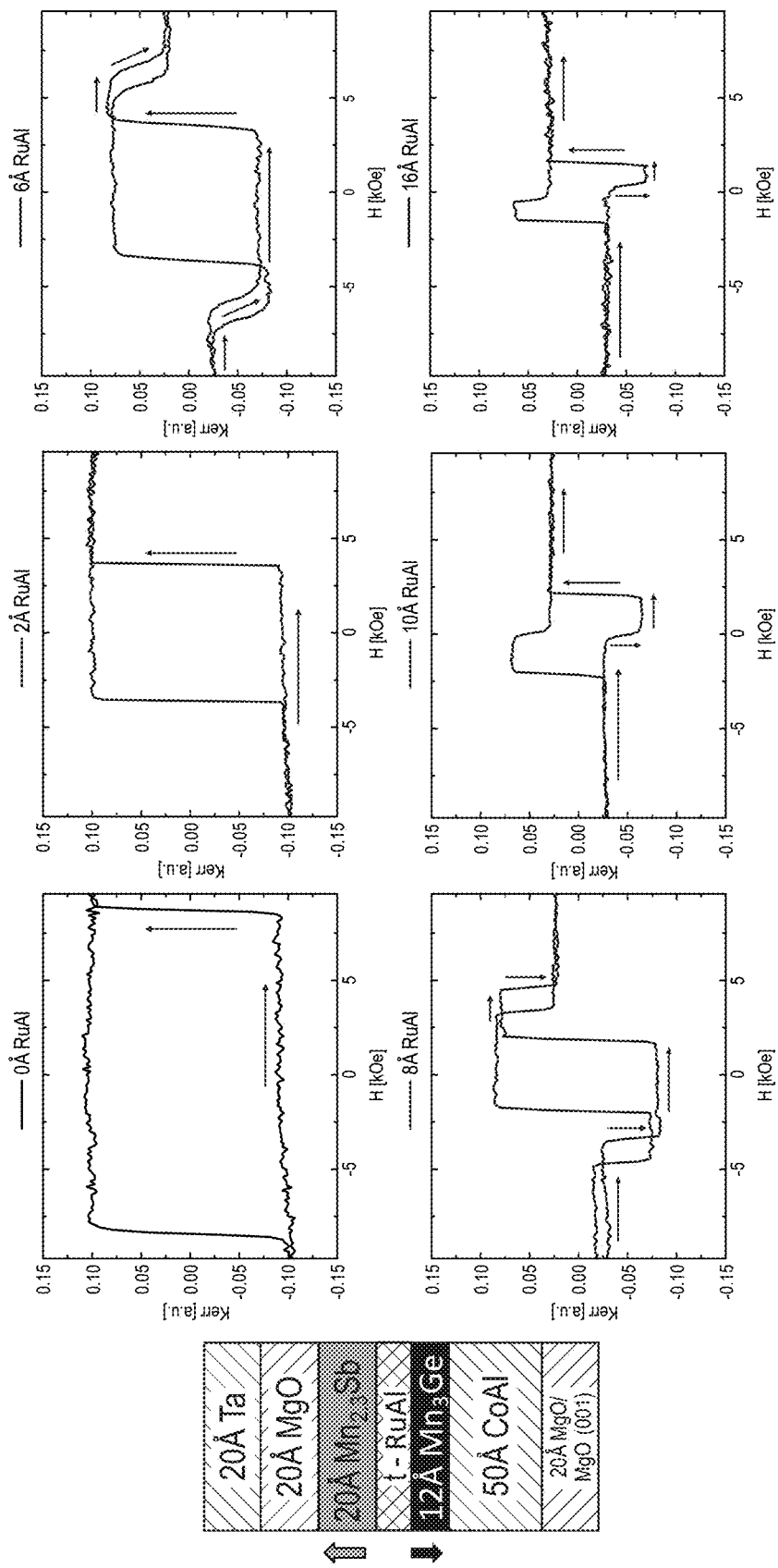
FIG. 5. P-MOKE hysteresis loops of Heusler stacks (see left hand side of FIG. 5) having respective RuAl spacer layers of thicknesses 0, 2, 6, 8, 10, and 16 Å.

FIG. 5 summarizes the P-MOKE hysteresis loops measured from samples having two layers of different Heusler compounds separated by a non-magnetic spacer layer of RuAl (of varying thickness, t). The stack of these samples was MgO(001)/20 Å MgO/50 Å CoAl/12 Å $Mn_3Ge$/t=0, 2, 6, 8, 10, and 16 Å RuAl/20 Å $Mn_{2.3}Sb$/20 Å MgO/20 Å Ta. The samples with t=0 and 2 Å RuAl display a single square hysteresis loop indicative of ferromagnetic coupling between the Heusler layers. For samples with t=6, 8, 10, and 16 Å of RuAl, the coupling between the Heusler layers is anti-ferromagnetic.

Figure 6A:
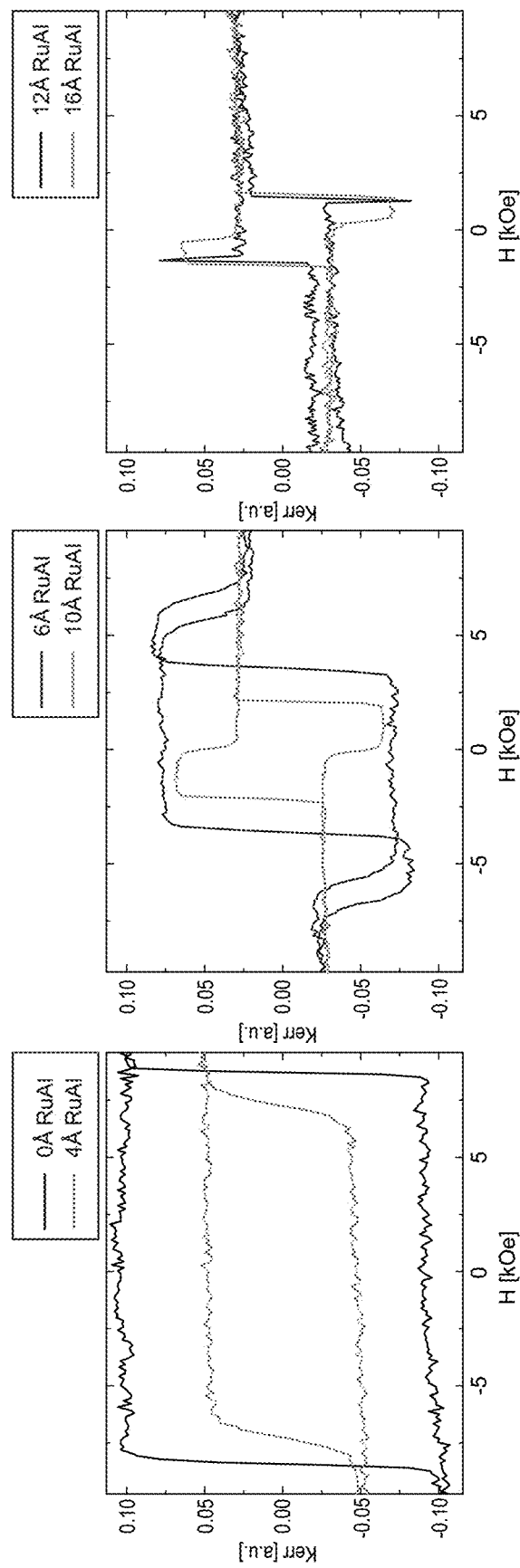
FIG. 6A. P-MOKE hysteresis loops of Heusler stacks (see stack structure shown in FIG. 5) interposed with spacer layers of RuAl.
Figure 6B:
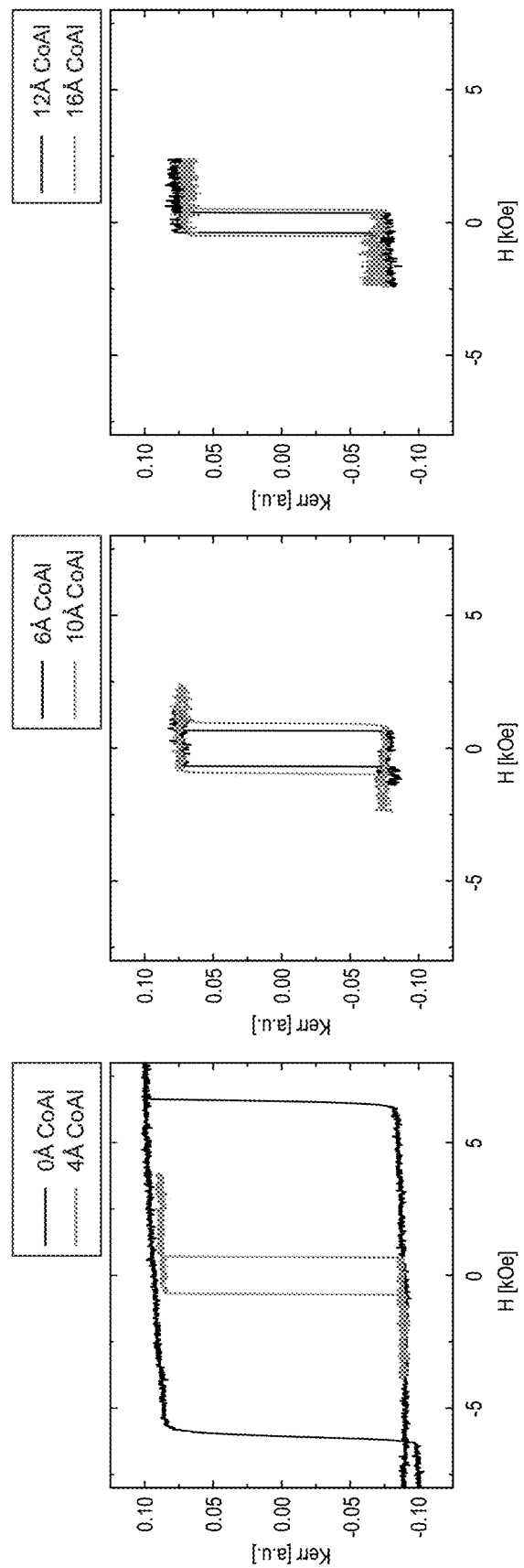
FIG. 6B. P-MOKE hysteresis loops of Heusler stacks (see stack structure shown in FIG. 5) interposed with spacer layers of CoAl.

FIG. 6A and FIG. 6B compare the P-MOKE hysteresis loops measured on samples having two layers of Heusler compounds separated by a non-magnetic spacer layer of RuAl (see FIG. 6A) and CoAl (see FIG. 6B). The spacer layer thickness t is varied from 0 to 16 Å. The stack of these samples was MgO(001)/20 Å MgO/50 Å CoAl/12 Å Mn$_3$Ge/t RuAl or CoAl/20 Å Mn$_3$Sb/20 Å MgO/20 Å Ta. The thickness of the RuAl spacer layer varied from t=0 to 16 Å in 1 Å increments (only some of the data are shown) and the thickness of the CoAl spacer layer was t=0, 4, 6, 7, 8, 9, 10, 12, 14 and 16 Å (again, only some of the data are shown for clarity). The hysteresis loops obtained for samples with a CoAl spacer layer show a single square hysteresis loop for all CoAl thicknesses studied here, which is different than what was obtained for samples having a RuAl spacer layer (discussed in greater detail with respect to FIG. 9 and FIG. 10B below). The two Heusler layers separated by a CoAl spacer layer are coupled ferromagnetically for all thicknesses, and there is no evidence of the formation of an SAF structure.

Figure 7A:
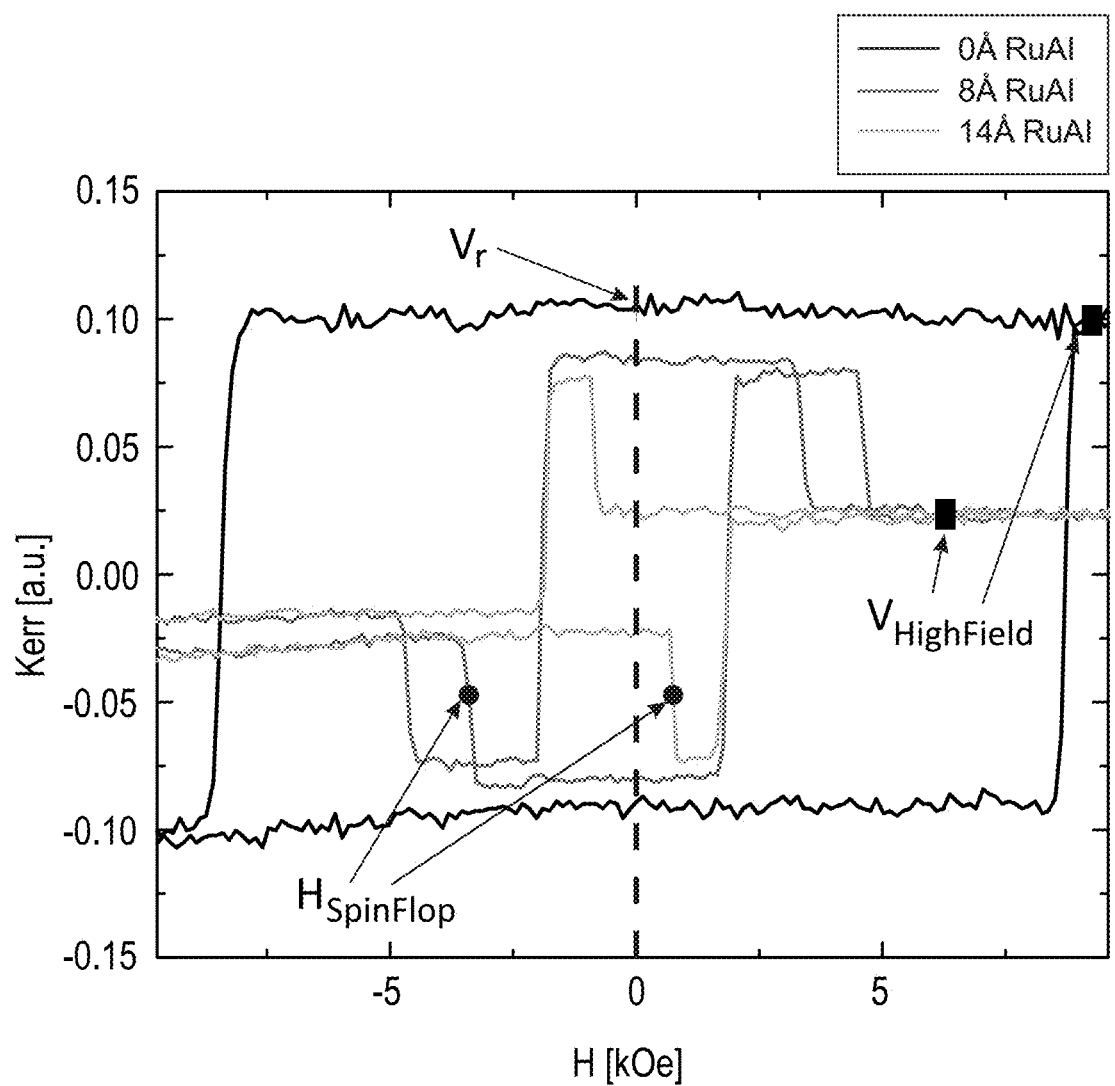
FIG. 7A. P-MOKE hysteresis loops of Heusler stacks (see stack structure shown in FIG. 5) including respective RuAl spacer layers whose thicknesses are 0, 8, and 14 Å. The $V_r$, $V_{HighField}$, and $H_{SpinFlop}$ are illustrated.
Figure 7B:
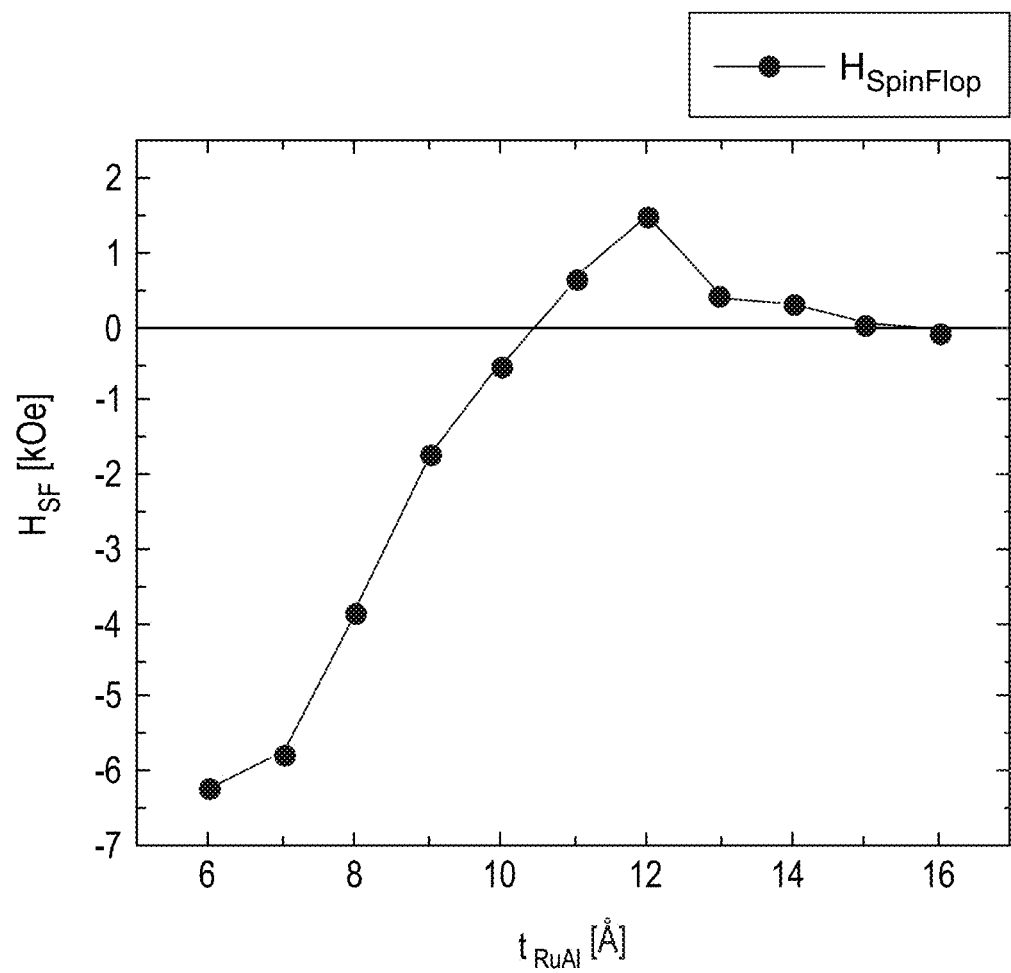
FIG. 7B. Variation of $H_{SpinFlop}$ as a function of the thickness of the RuAl spacer layer.
Figure 7C:
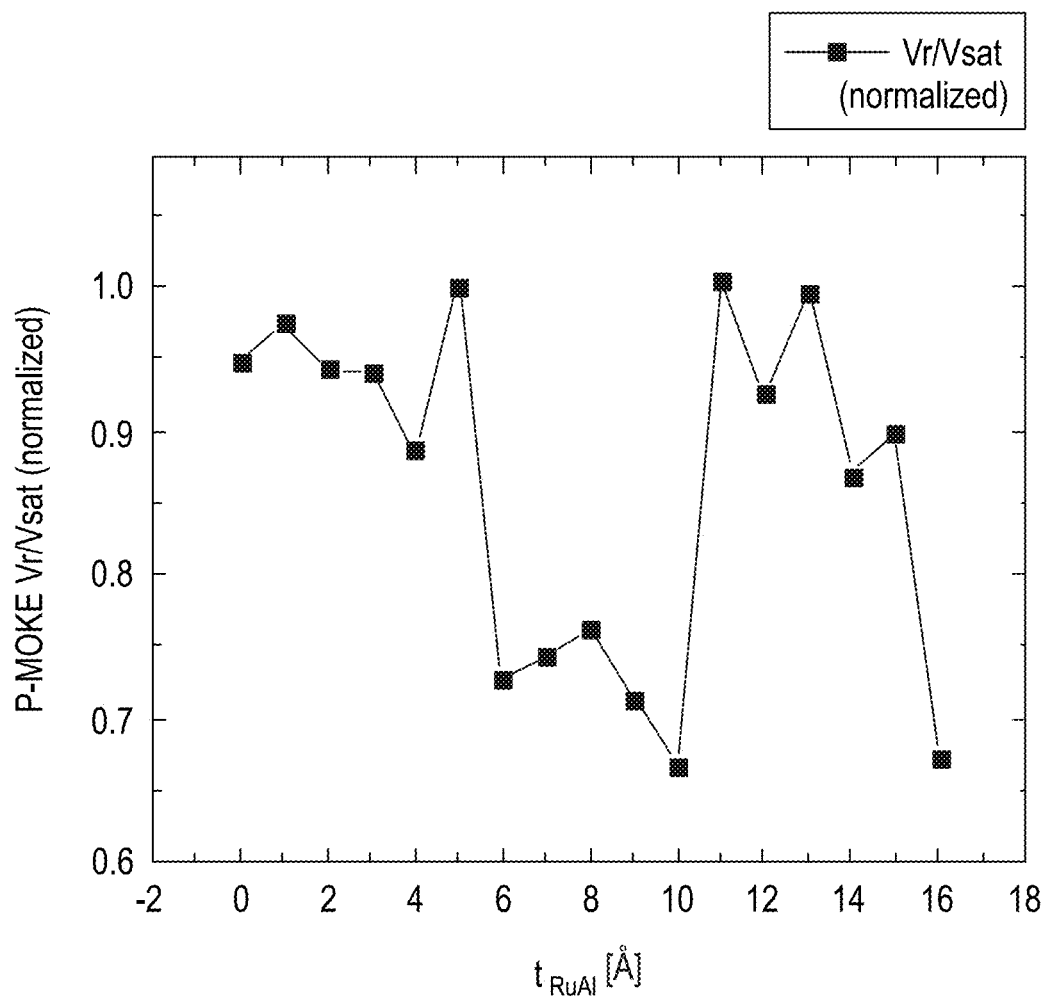
FIG. 7C. Remanent Kerr signal voltage divided by Kerr signal voltage at saturation, as a function of the thickness of the RuAl spacer layer.

The dependence of the hysteresis loops for samples with a RuAl spacer layer are detailed in FIG. 7A, FIG. 7B, and FIG. 7C. FIG. 7A shows hysteresis loops from samples having a RuAl spacer layer whose thickness t was 0, 8, and 14 Å. The P-MOKE signal measured at H=0 kOe is $V_r$ (representing the remanent state), and the P-MOKE signal measured at a high applied field of ~1.4 T (not within the displayed region) is $V_{HighField}$ (representing the saturated state), whose magnitude is illustrated with the dark rectangles at a much lower field strength. When the field H is swept, the relative orientation of the magnetization of the two Heusler layers switches from parallel to anti-parallel. The $H_{SF}$ depends on the RuAl spacer thickness and is indicated by solid dark circles in FIG. 7A. FIG. 7B shows the variation of $H_{SF}$ with RuAl spacer layer thickness. The sign of $H_{SF}$ indicates the type of coupling between the two Heusler layers, which is negative for anti-ferromagnetic coupling and positive for ferromagnetic coupling. Thus, based on the P-MOKE results, the coupling between the two Heusler layers is anti-ferromagnetic for t between about 6 and 10 Å as well as for t between about 16 and approximately 20 Å (see also FIG. 7C); the coupling is ferromagnetic for the other thicknesses studied. FIG. 7C shows the ratio of $V_r$ to $V_{sat}$ where $v_{sat}=V_{HighField}$ for ferromagnetic coupling and $v_{sat}=V_r+V_{HighField}$ for anti-ferromagnetic coupling.

Figure 8:
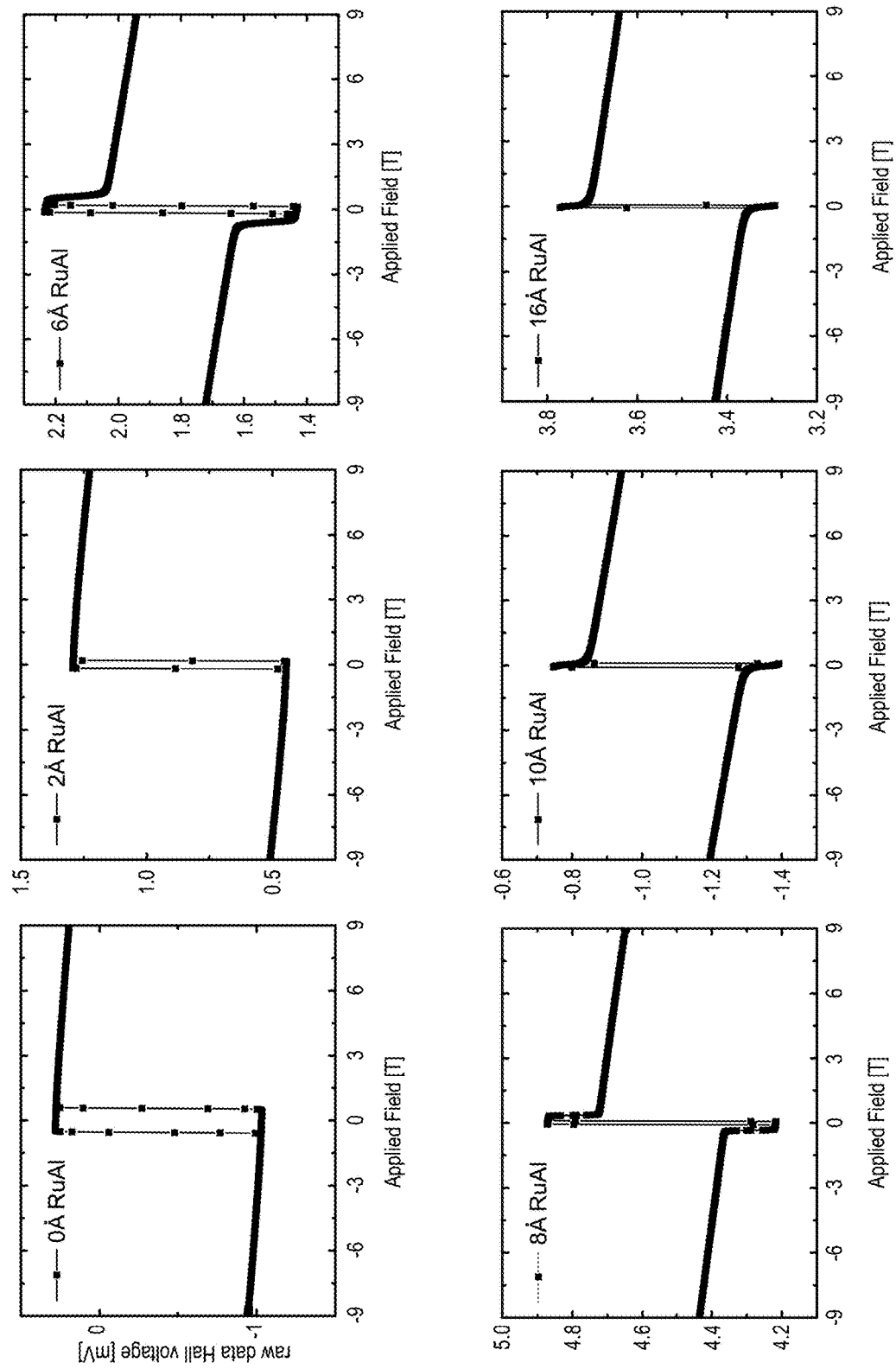
FIG. 8. Anomalous Hall Effect (AHE) measurement for Heusler stacks (see stack structure shown in FIG. 5) having a RuAl spacer layer.

The anomalous Hall Effect (AHE) signals for the samples described above were measured in a Quantum Design Dyna-Cool apparatus at room temperature. These measurements are summarized in FIG. 8 for Heusler layers separated by RuAl layers of various thicknesses. The sample resistivity was measured using a standard Hall measurement geometry in which wire was bonded to the four corners of the square sample (10 mm×10 mm). The measured resistivity depends on the Lorentz force (which has a linear dependence on applied field (H)) and the AHE. After subtracting background from the resistivity data, the AHE signal was determined at zero field, $\rho_r^{AH}$ (remanent, H=0) and maximum applied field, $\rho_{sat}^{AH}$ (saturated, $H_{sat}$). The AHE signal ($\rho_{AH}$) is opposite for the two Heusler compounds, consistent with the P-MOKE measurements. The following three equations were used to determine the AHE signal of the Heusler compounds in both the remanent ($\rho_{AH}^{H=0}$) and saturated ($\rho_{AH}^{Hsat}$) state.

$$\rho_r^{AH}=\rho_{AH}^{H=0}$$

$$\rho_{Sat}^{AH}=\rho_{AH}^{Hsat} \text{ for a ferromagnet (FM)}$$

$$\rho_{Sat}^{AH}=(\rho_{AH}^{H=0}+\rho_{AH}^{Hsat}) \text{ for an anti-ferromagnet (AFM)}$$

Figure 9:
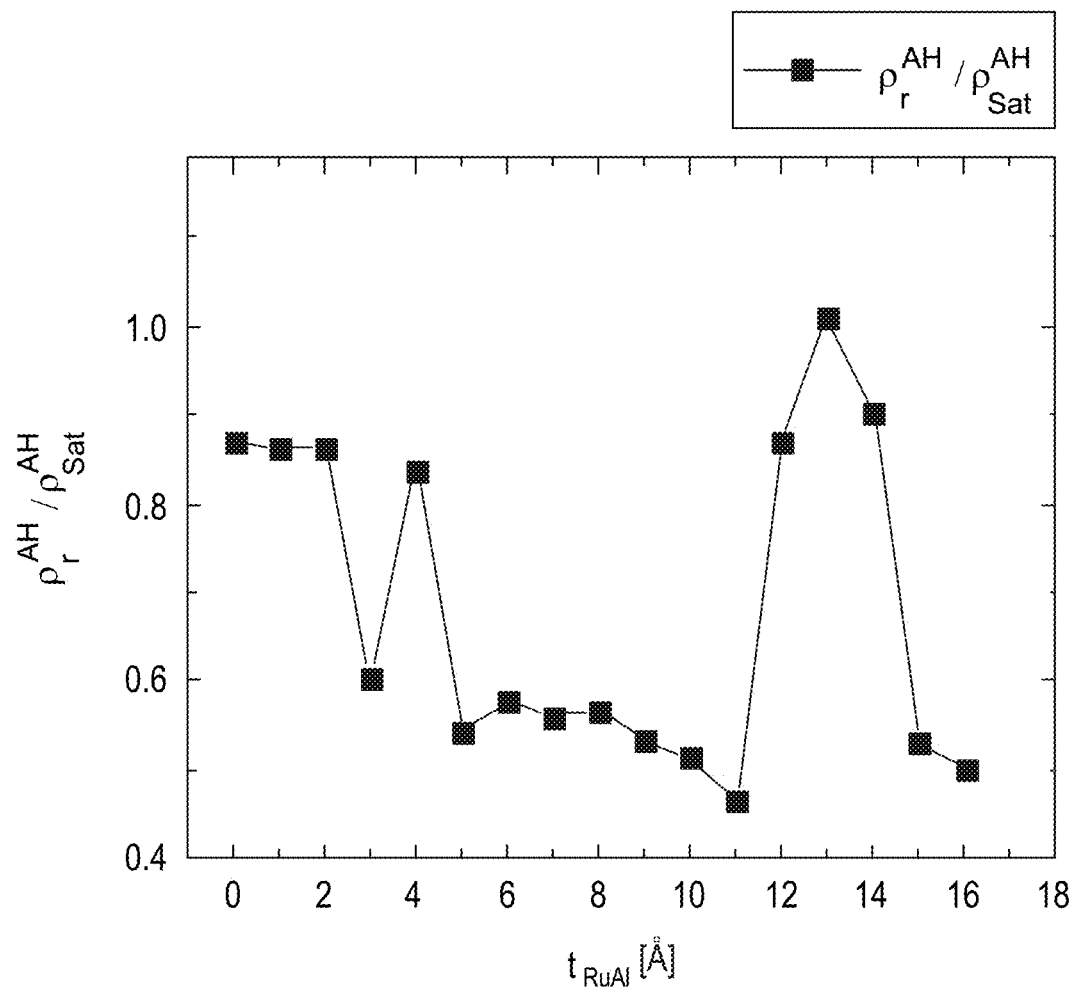
FIG. 9. Normalized Anomalous Hall Effect resistivity ratio determined for the remanent ($\rho_r^{AH}$) and saturated ($\rho_{sat}^{AH}$) state for Heusler stacks (see stack structure shown in FIG. 5) of varying RuAl spacer layer thickness.

FIG. 9 shows the variation of the ratio ($\rho_r^{AH}/\rho_{Sat}^{AH}$), determined from the AHE as a function of the RuAl spacer layer thickness. These results indicate that at low spacer layer thickness ($t_{RuAl}$<4 Å), the coupling between the Heusler layers is ferromagnetic. For a spacer layer thickness in the range of 4 to 11 Å, the coupling between the Heusler layers is anti-ferromagnetic. The coupling is ferromagnetic again for spacer layer thicknesses in the range 12 to 15 Å.

Figure 10A:
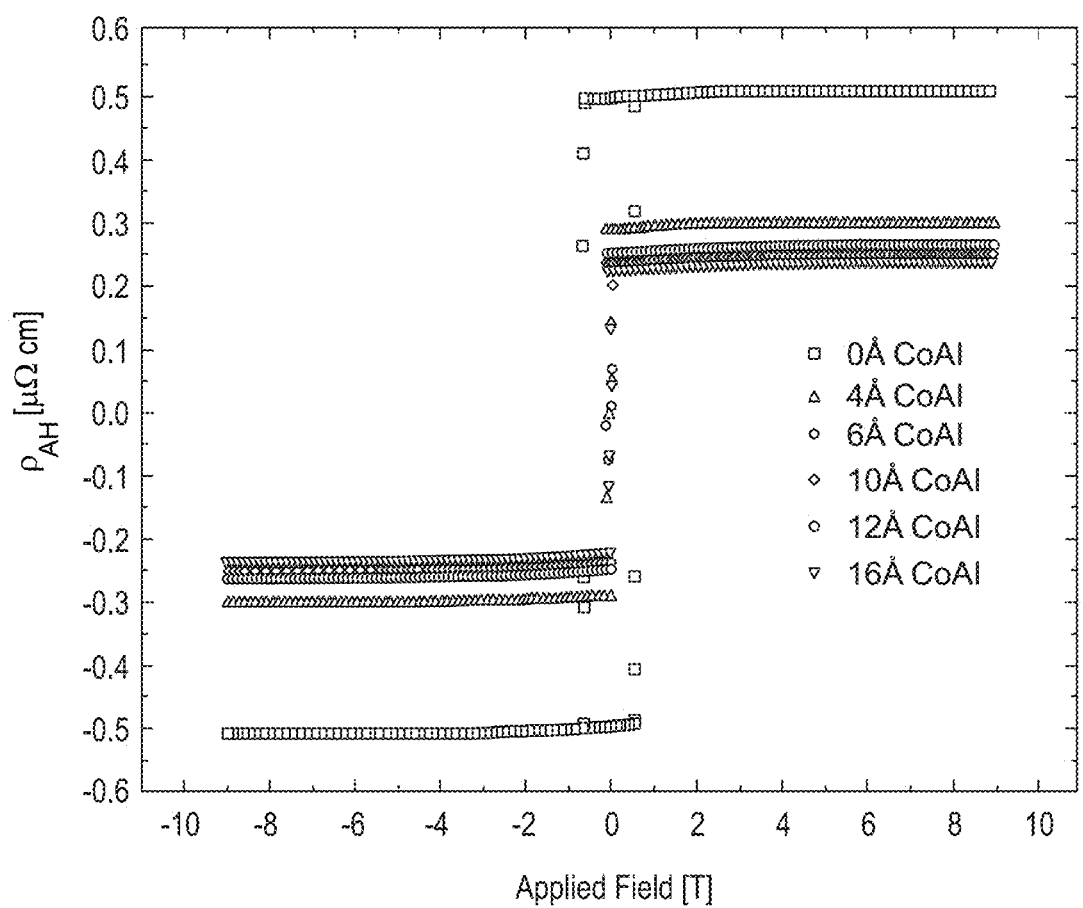
FIG. 10A. AHE signal from various Heusler stacks (see stack structure shown in FIG. 5, but with CoAl replacing the RuAl as the spacer) that include a CoAl spacer layer.
Figure 10B:
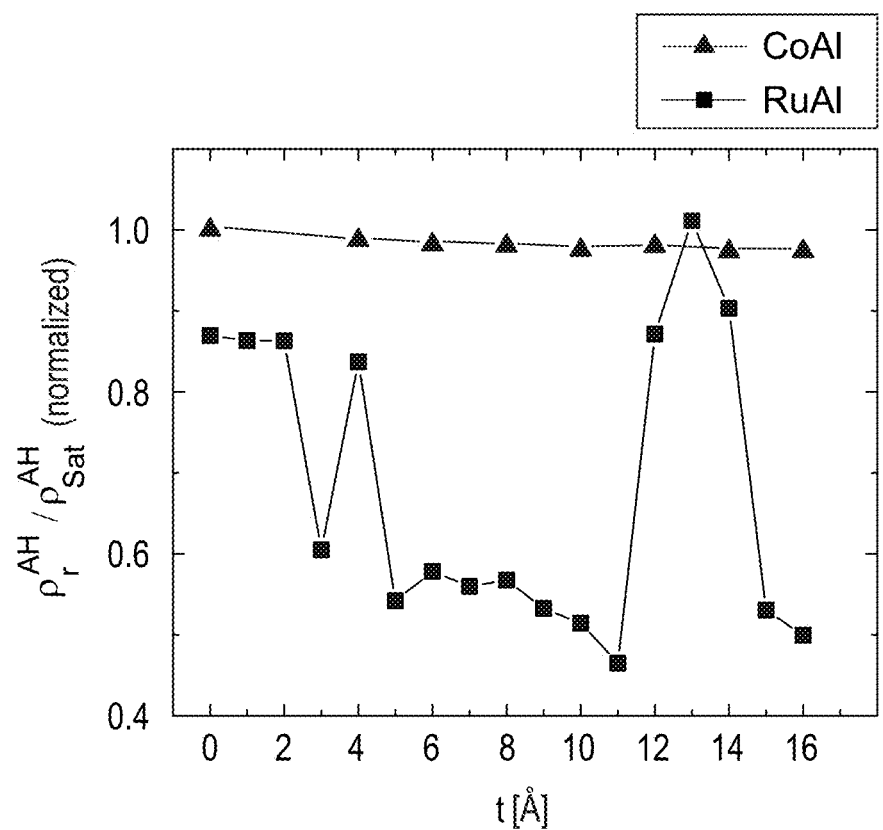
FIG. 10B. Comparison of normalized AHE resistivity ratio ($\rho_r^{AH}/\rho_{sat}^{AH}$) for Heusler stacks including RuAl and CoAl spacer layers.
Figure 10C:
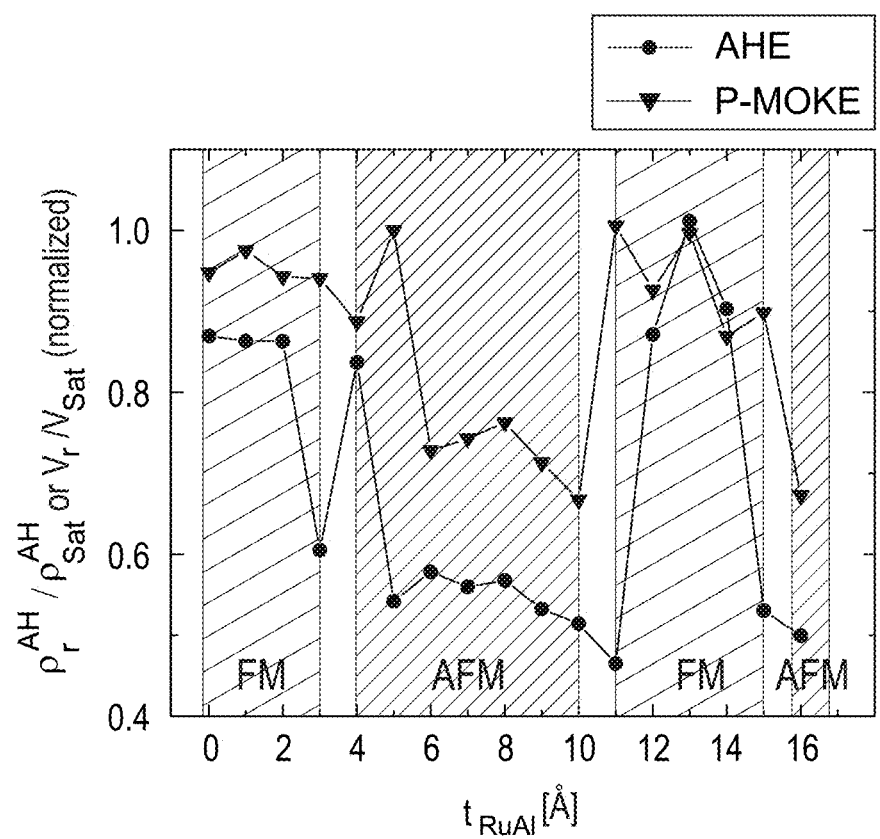
FIG. 10C. Comparison of normalized AHE resistivity ratio ($\rho_r^{AH}/\rho_{sat}^{AH}$) and normalized ($V_r/V_{sat}$) from P-MOKE for the Heusler stacks including RuAl.

FIG. 10A shows the AHE for Heusler layers having CoAl as the spacer layer. The ratio ($\rho_r^{AH}/\rho_{Sat}^{AH}$) for these samples is ~1 and is independent of the thickness of the CoAl layer, as shown in FIG. 10B, which compares the ratio ($\rho_r^{AH}/\rho_{Sat}^{AH}$) for two spacer layers, CoAl and RuAl. The coupling between the two Heusler compounds is ferromagnetic when CoAl is used as the spacer layer. The ratios ($\rho_r^{AH}/\rho_{Sat}^{AH}$) or ($V_r/V_{sat}$), as determined from AHE and P-MOKE, are compared in FIG. 10C and found to be largely consistent. Thus, a RuAl spacer layer enables anti-ferromagnetic coupling between two Heusler layers, resulting in a synthetic anti-ferromagnet for an appropriate RuAl thickness.

The structural ordering of ultrathin layers is likely due to the distinct chemical properties of the elements Ru and Al in the templating spacer layer. As an alternative to Al, Al alloys such as AlSn, AlGe, AlGa, AlGaGe, AlGaSn, AlGeSn, and AlGaGeSn may be employed. Binary (X=Y) and ternary Heusler alloys consist of two/three different types of atoms, respectively. In X$_2$YZ Heuslers, the Z main group element typically has high chemical affinity for X and Y. In this context, the formation of an ordered structure should take place, irrespective of the choice of Z. An example of a ternary Heusler compound that could be used is Mn$_{3.1-x}$Co$_{1.1-y}$Sn, wherein x≤1.2 and y≤1.0. The Heusler SAF structure could comprise a ternary Heusler compound as either the first Heusler layer, the second Heusler layer, or both Heusler layers.

Mn$_{2.3}$Sb is also considered to be part of the family of L1$_0$ compounds and hence the results discussed above indicate that the RuAl templating spacer layer would also be effective in inducing SAF ordering between two L1$_0$ compounds (whose constituent elements include one transition metal element and a main group element). Other candidate L1$_0$ compounds are MnAl alloys, MnGa alloys, MnSn alloys, MnGe alloys, and FeAl alloys.

Figure 11:
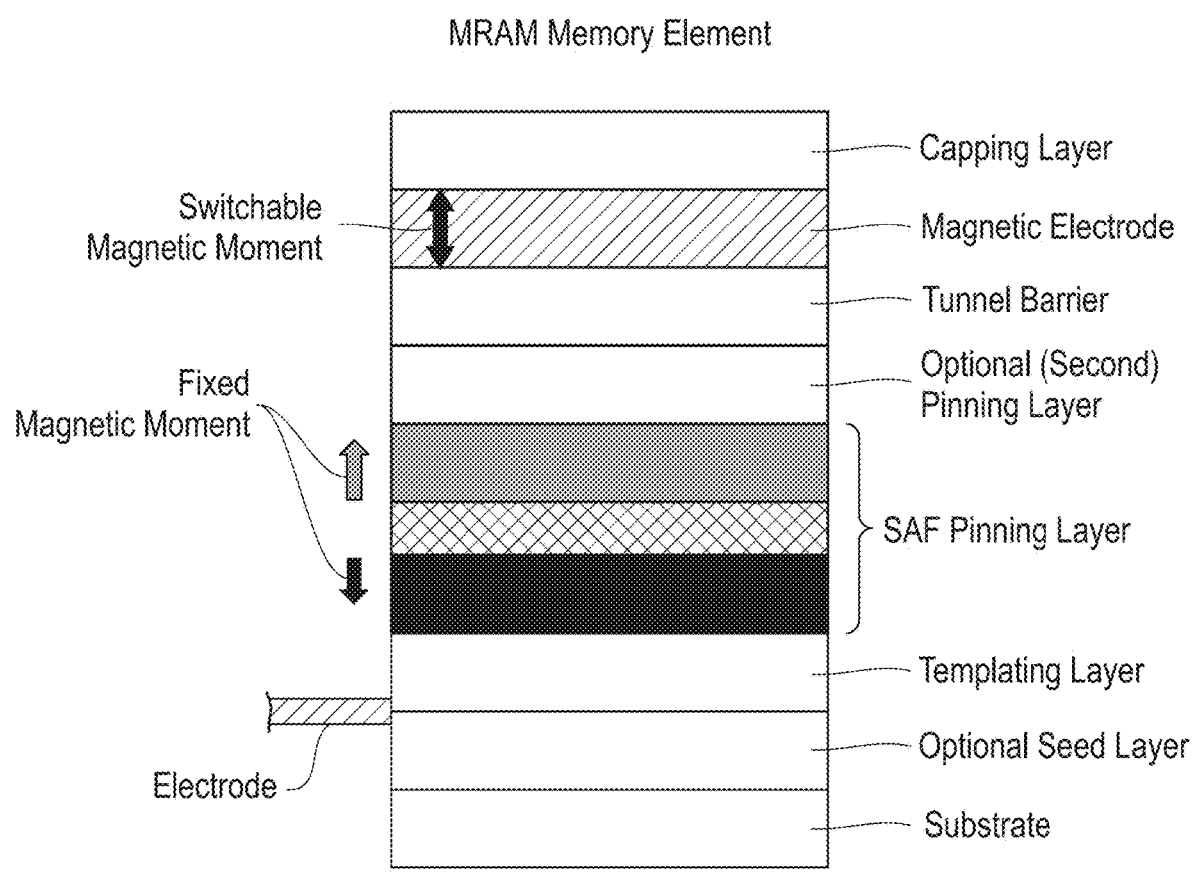
FIG. 11. Illustration of a magnetic tunnel junction device that incorporates the synthetic anti-ferromagnet structure having the Heusler layers (and the corresponding spacer layer) described herein.

The structures described herein lend themselves to a variety of applications, including MRAM elements and a racetrack memory device, such as that described in U.S. Pat. No. 6,834,005, issued Dec. 21, 2004 and titled "Shiftable magnetic shift register and method of using the same," which is hereby incorporated herein. One such MRAM element is shown in FIG. 11. As with MRAM elements generally, a tunnel barrier is situated between two magnetic electrodes, one of which has a fixed magnetic moment and the other of which has a magnetic moment that is switchable, thereby permitting the recording and erasing of data. Unlike MRAM elements of the prior art, however, the magnetic layer of FIG. 11 having the fixed magnetic moment (pinning layer) comprises Heusler layers separated by a non-magnetic spacer (such as those described herein). An optional (second) pinning layer may be advantageously employed for even better performance.

The templating layer of FIG. 11 is, as described previously herein, a multi-layered structure that is non-magnetic at room temperature, and which comprises alternating layers of Co and at least one other element E (preferably Al or Ga; or Al alloyed with Ga, Ge, Sn or any combination thereof, such as AlSn, AlGe, AlGa, AlGaGe, AlGaSn, AlGeSn, and AlGaGeSn). The composition of this structure is represented by $Co_{1-x}E_x$, with x preferably being in the range from 0.45 to 0.55 (close to a ratio of 1:1, to facilitate growth of alternating layers). At high Co concentrations, the Co-E alloy would be magnetic; also, deviations from 1:1 would also make growth of these structures difficult or impossible. An optional seed layer may be interposed between the substrate and the templating layer. Overlying the templating layer is a Heusler SAF structure which includes a first Heusler compound, e.g., $Mn_3Ge$, $Mn_3Sn$, or $Mn_3Sb$. Although these three binary Heusler compounds are mentioned with respect to their ideal stoichiometry representation (i.e., $Mn_3Z$ where Z=Ge or Sn or Sb), their stoichiometry can vary over a limited range as discussed below. For $Mn_{3.1-x}Ge$ and $Mn_{3.1-x}Sn$, x can be in the range from 0 to 0.6; for $Mn_{3.1-x}Sb$, x can be in the range from 0 to 1.1. A spacer layer that includes both Ru and at least one other element E (having a composition represented by $Ru_{1-x}E_x$, with x being in the range from 0.45 to 0.55) is in contact with the first Heusler layer. A second Heusler layer chosen independently from the group $Mn_3Ge$, $Mn_3Sn$, and $Mn_3Sb$ is in contact with the spacer layer. The magnetic moments of the first and second Heusler layers are fixed and anti-parallel to each other. An optional, second pinning layer may be used to increase performance, and may include Fe, a CoFe alloy, or $Co_2MnSi$.

The tunnel barrier is preferably MgO (001), although other (001)-oriented tunnel barriers may be used, such as CaO and LiF. Alternatively, an insulator with a spinel structure such as $MgAl_2O_4$ can be used as a tunnel barrier; its lattice spacing could be tuned by controlling the Mg—Al ratio, which would result in better lattice matching with the Heusler compounds (more preferably, the Mg—Al composition is $Mg_{1-z}Al_{2-z}O_4$, wherein $-0.5<z<0.5$). The switchable magnetic electrode overlying the tunnel barrier may comprise Fe, a CoFe alloy, or a CoFeB alloy, for example. The capping layer may comprise Mo, W, Ta, Ru, or a combination thereof. Current may be induced by applying a voltage between the two magnetic electrodes, which are separated by the tunnel barrier.

Certain structures described herein may also be used in racetrack memory devices. In this case, the racetrack may be a nanowire that includes a substrate, an optional seed layer, a templating layer, and a first magnetic layer that includes two Heusler compounds separated by non-magnetic spacer layer. (See the discussion above with respect to FIG. 11 for possible compositions of these layers. Note that in a racetrack memory device, the tunnel barrier and the switchable magnetic layer shown in FIG. 11 would not normally be present; however, in this case the first magnetic layer shown in FIG. 11 would have a magnetic moment that is switchable rather than fixed.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of several methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A device, comprising:
a multi-layered structure that includes:
a first layer that includes a first magnetic Heusler compound;
a second layer that is non-magnetic at room temperature, the second layer (i) being in contact with and overlying the first layer and (ii) comprising both Ru and at least one other element E, wherein the composition of the second layer is represented by $Ru_{1-x}E_x$, with x being in the range from 0.45 to 0.55; and
a third layer in contact with and overlying the second layer, the third layer including a second magnetic Heusler compound.

2. The device of claim 1, wherein x is in the range from 0.47 to 0.53.

3. The device of claim 1, wherein E is Al.

4. The device of claim 1, wherein the magnetic moments of the first and third layers are substantially perpendicular to interfaces between (i) the second layer and (ii) the first and third layers, respectively.

5. The device of claim 1, wherein the first and third layers each have a thickness of less than 5 nm.

6. The device of claim 1, wherein the first and third layers each have a thickness of less than 3 nm.

7. The device of claim 1, wherein the second layer has a thickness in the range of 6 to 10 Å.

8. The device of claim 7, wherein the magnetic moments of the first and third layers are substantially anti-parallel to each other.

9. The device of claim 1, wherein the first and second magnetic Heusler compounds are independently selected from the group consisting of $Mn_{3.1-x}$ Ge, $Mn_{3.1-x}Sn$, and $Mn_{3.1-x}Sb$, with x being in the range from 0 to 1.1 in the case of $Mn_{3.1-x}Sb$, and with x being in the range from 0 to 0.6 for $Mn_{3.1-x}Ge$ and $Mn_{3.1-x}Sn$.

10. The device of claim 1, herein the first and/or the second magnetic Heusler compound is a ternary Heusler compound.

11. The device of claim 10, wherein the ternary Heusler compound is $Mn_{3.1-x}Co_{1.1-y}Sn$, wherein $x \leq 1.2$ and $y \leq 1.0$.

12. The device of claim 1, wherein the magnetic moments of the first and third layers are substantially parallel to interfaces between (i) the second layer and (ii) the first and third layers, respectively.

13. The device of claim 12, wherein the magnetic moments of the first and third layers are substantially anti-parallel to each other, and wherein the second layer has a thickness in the range of 6 to 10 Å.

14. The device of claim 1, wherein E is an AlGe alloy.

15. The device of claim 1, wherein E is an AlGa alloy.

16. The device of claim 1, wherein E includes an alloy selected from the group consisting of AlSn, AlGe, AlGaGe, AlGaSn, AlGeSn, and AlGaGeSn.

17. The device of claim 1, comprising a substrate underlying the multi-layered structure.

18. The device of claim 17, comprising a tunnel barrier overlying the multi-layered structure, thereby permitting current to pass through both the tunnel barrier and the multi-layered structure.

19. The device of claim 18, comprising an additional magnetic layer in contact with the tunnel barrier.

20. The device of claim 19, wherein the tunnel barrier is MgO.

21. The device of claim 19, wherein the tunnel barrier is $Mg_{1-z}Al_{2-z}O_4$ wherein $-0.5<z<0.5$.

22. A method, comprising:
using the device of claim 19 as a memory element.

23. A method, comprising:
using the device of claim 17 as an element of a racetrack memory device.

24. A device, comprising:
a substrate;
a multi-layered structure overlying the substrate; the structure comprising a first layer, a second layer, and a third layer, wherein:
the first layer includes a first magnetic Heusler compound,
the second layer is non-magnetic at room temperature and comprises Ru and E,
wherein E comprises at least one other element that includes Al, the composition of the second layer being given by $Ru_{1-x}E_x$, with x in the range from 0.45 to 0.55; and
the third layer includes a second magnetic Heusler compound;
a tunnel barrier overlying the multi-layered structure; and
an additional magnetic layer in contact with the tunnel barrier, wherein the additional magnetic layer has a switchable magnetic moment.

25. The device of claim 24, comprising a capping layer in contact with the additional magnetic layer.

26. The device of claim 24, wherein the first layer and/or the third layer include Mn and an element selected from the group consisting of Sn, Sb, and Ge.

27. The device of claim 26, wherein at least one of the first and third layers includes Co.

28. A device, comprising:
a multi-layered structure comprising a first layer, a second layer, and a third layer, wherein:
the first layer is magnetic and includes a Heusler and/or a $L1_0$ compound,
the second layer is non-magnetic at room temperature and comprises Ru and E, wherein E comprises at least one other element that includes Al, the composition of the second layer being represented by $Ru_{1-x}E_x$, with x in the range from 0.45 to 0.55; and
the third layer is magnetic and includes a Heusler and/or a $L1_0$ compound.

29. The device of claim 28, wherein the magnetic moments of the first and third layers are substantially perpendicular to respective interfaces of the first and third layers with the second layer.

30. The device of claim 28, wherein the $L1_0$ compound is selected from the group consisting of MnGa, MnAl, FeAl, MnGe, MnSb, and MnSn alloys.

31. The device of claim 28, including a tunnel barrier in contact with the multi-layered structure and one of the magnetic layers.

32. A method, comprising using the device of claim 31 as an MRAM element.

33. A method, comprising using the device of claim 28 as a memory element.

34. The method of claim 33, wherein the memory element is part of a racetrack memory device.

* * * * *